US010823791B2

(12) United States Patent
Biber (10) Patent No.: US 10,823,791 B2
(45) Date of Patent: Nov. 3, 2020

(54) METHOD AND MAGNETIC RESONANCE APPARATUS FOR MONITORING A COOLING SYSTEM OF THE MAGNETIC RESONANCE APPARATUS

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 112 days.

(21) Appl. No.: 16/123,206

(22) Filed: Sep. 6, 2018

(65) Prior Publication Data

US 2019/0072624 A1    Mar. 7, 2019

(30) Foreign Application Priority Data

Sep. 6, 2017   (EP) .................................... 17189644

(51) Int. Cl.
| | | |
|---|---|---|
| *G01R 33/34* | (2006.01) | |
| *G01R 33/58* | (2006.01) | |
| *G01R 33/385* | (2006.01) | |
| *G01R 33/54* | (2006.01) | |

(52) U.S. Cl.
CPC ..... *G01R 33/3403* (2013.01); *G01R 33/3852* (2013.01); *G01R 33/3856* (2013.01); *G01R 33/543* (2013.01); *G01R 33/583* (2013.01)

(58) Field of Classification Search
CPC ............ G01R 33/3856; G01R 33/3804; G01R 33/3403
See application file for complete search history.

(56) References Cited

U.S. PATENT DOCUMENTS

| | | | | |
|---|---|---|---|---|
| 6,065,345 A | * | 5/2000 | Holenstein | ............ F04D 29/128 73/579 |
| 2002/0156595 A1 | | 10/2002 | Hedlund et al. | |
| 2006/0225433 A1 | * | 10/2006 | Jammu | ..................... F25B 9/14 62/6 |
| 2010/0085053 A1 | | 4/2010 | Iwasa et al. | |

FOREIGN PATENT DOCUMENTS

DE      202017001501 U1     5/2017

OTHER PUBLICATIONS

Biber, "Use of Distributed Sensors for Monitoring the Cooling System of Magnetic Resonance Tomographs," Siemens AG (2017).

* cited by examiner

*Primary Examiner* — Alesa Allgood
(74) *Attorney, Agent, or Firm* — Schiff Hardin LLP

(57) ABSTRACT

In a method and magnetic resonance apparatus for monitoring functioning of a cooling system of the apparatus, at least some apparatus components, that are to be cooled by the cooling system, have respective temperature sensors in thermal communication therewith. A start temperature of at least one of the components is determined by at least one of the sensors, and a computer determines, from the start temperature, at least one comparison variable that describes a reference temperature change due to power input to the respective component. The at least one temperature sensor provides the computer with a measured variable that describes actually occurring temperature change due to the power input. The computer compares the measured variable with the comparison variable and determines whether the comparison result fulfills an action criterion and, if so, the computer initiates implementation of an action associated with the action criterion.

21 Claims, 3 Drawing Sheets

FIG 3

METHOD AND MAGNETIC RESONANCE APPARATUS FOR MONITORING A COOLING SYSTEM OF THE MAGNETIC RESONANCE APPARATUS

BACKGROUND OF THE INVENTION

Field of the Invention

The invention concerns a method for monitoring functioning of a cooling system of a magnetic resonance apparatus having multiple components to be cooled by the cooling system, and temperature sensors associated with at least some of the components. The invention also concerns a magnetic resonance apparatus and a non-transitory electronically readable data storage medium designed to implement such a method.

Description of the Prior Art

A magnetic resonance (MR) apparatus is a complex system in which, in addition to a superconducting magnet that may be present, a large number of components generate waste heat, which has to be dissipated by an appropriate cooling system. Components to be cooled include the gradient coil arrangement (GC), the gradient amplifiers (GPA), the compressor (MREF) that drives the cold head for cooling the superconducting magnet, and the radio frequency power amplifiers (RFPA). Further, smaller components, for example an image computer and a control computer, transformers, and network parts for generating the required voltages, can also be cooled by a cooling system of this kind, which conventionally uses a liquid coolant.

Conventional cooling systems are equipped with a large number of sensors that monitor the flow of the coolant, and temperatures at different sensor locations. The sensors can be read by a control processor of the cooling system and, via a standardized bus system (for example CAN, SPI, I2C), the signals therefrom passed to a control computer of the magnetic resonance apparatus. The sensor data made available to the control computer of the magnetic resonance apparatus in this way can be used for monitoring the cooling system in situ, for remote maintenance, or for preventive maintenance, by the sensor data or metadata derived therefrom being transmitted to a central arithmetic processor outside of the magnetic resonance apparatus.

Problems with these known monitoring options are the high costs and the high level of complexity for the sensors and the electronic devices of the cooling system.

To achieve an improvement in this context, in an article by Stephan Biber, "Nutzung von verteilter Sensorik zur monitoring des cooling system von Magnetresonanztomographen" [Use of Distributed Sensors for Monitoring the Cooling System of Magnetic Resonance Tomographs], 2016, DOI: 10.18169/PAPDEOTT005284, it is proposed to at least largely dispense with the cooling system-side sensors and instead to replace temperature monitoring of the cooling system at least partially with temperature monitoring of the components that are connected to the cooling system. This makes use of the fact that most such components have their own temperature monitoring system anyway. In this way, overheating of components is detected but, in order to be able to obtain sufficient information about the status of the cooling system and to purposefully detect causes of faults, the cooling system still continues to be provided with its own expensive additional sensors. This proposed monitoring therefore does achieve a simplified overheating monitoring process, but expensive and complex sensors and electronic devices still have to be present for specific determinations about faults or restrictions.

SUMMARY OF THE INVENTION

An object of the invention is to provide a reliable procedure and apparatus, which are optimally simple and inexpensive to implement, for monitoring such a cooling system with respect to specific faults and/or restrictions of the cooling system, in particular with respect to early detection of problems and/or preventive maintenance.

In the inventive method for monitoring the functioning of the cooling system of an MR apparatus with respect to at least one of the components of the MR apparatus, to which there is an input of power, a start temperature of that component is determined by the temperature sensors associated with that component, and a comparison variable that describes a reference temperature change due to the power input is determined from the start temperature. A measured variable that describes temperature change that actually occurs due to the power input is measured by the temperature sensor associated with the component. The measured variable is compared with the comparison variable, and when an action criterion that evaluates at least the current comparison result is fulfilled, an action associated with the action criterion is carried out and/or the comparison result is logged by storage for subsequent evaluation.

It is particularly advantageous to use power data that describe a time-based power input to the relevant component, and then to determine, from the start temperature and the power data, at least one comparison variable that describes a change in comparison temperature due to the power input.

The association of a temperature sensor with a component as used herein means that the respective temperature sensor supplies measured data, which describe the temperature of the component or from which the temperature of the component can be derived. Embodiments can also exist in which the temperature sensor (or even a number of temperature sensors) are arranged directly on the component.

In contrast to the prior art mentioned in the introduction, the invention does not involve pure temperature monitoring, particularly with respect to overheating, but instead monitoring of the cooling capacity that is actually present is implemented, by monitoring, preferably relative to power, which changes in temperature, in particular increases in temperature, occur. There is therefore no pure "overheating protection"; instead the temperature gradient is analyzed. On the basis of the power data, reference is preferably made in the case of known thermal loading to a comparison variable of the same thermal loading on the same component. Since the process can be carried out on a component-by-component basis, further refinement of the obtainable information results.

It is therefore a basis of the present invention to provide comparison variables for various power data and start temperatures, which variables ultimately describe a desired cooling capacity with a particular flow of the coolant or particular cooling effects. The power-based approach of the present invention therefore ultimately enables a conclusion to be made about the flow of coolant through the respective components. For this purpose, only temperature sensors, which are usually present anyway on the components of a magnetic resonance apparatus, are necessary, the measured data of such sensors describing the effects of the power input and cooling by the cooling system. In this way, the conventional complex flow sensor system is replaced in accordance with the invention by temperature sensors that are present in the magnetic resonance apparatus anyway and by an expanded evaluation of the measured data of these temperature sensors with the use of comparison variables, based on the power input, which can be determined from comparison measurements and/or thermal temperature change models of the components. This ultimately enables a conclusion to be made about flow properties in the cooling system.

In particular, cooling capacities that are decreasing or that already decreased, can be deduced in the results of comparison based on particular components or cooling branches of the cooling system. The purposeful detection of such decreases, which can mean that the flow rate of the coolant has decreased, can be used, for example, with respect to remote and/or preventive maintenance, before an actual fault occurs, or allow more reliable identification of a fault. The action criteria can target faults in particular. For example, with a cooling capacity that is too low, control processes of the magnetic resonance apparatus that prevent overheating, such as switching-off certain components, can be implemented as the action, and/or suitable warning signals can be emitted as the action. An evaluation of comparison results over time, since these have been stored and therefore logged, is useful for maintenance or prediction of faults that may possibly occur. For example, with a continuous reduction of the cooling capacity and therefore presumably of the coolant flow, slowly increasing blockage or closure of a cooling line can be inferred. Thus the comparison results obtained in accordance with the invention form an exceptional basis for detection of faults and/or reduced functions of the cooling system per se, and for more accurate analysis of the causes and/or origin of the decreasing cooling capacity of the cooling system.

The present invention is not based on a cooling system associated with a superconducting magnet of the magnetic resonance apparatus for the cooling thereof, but is based on a cooling system that uses water, for example, as the coolant for the further components of the magnetic resonance apparatus that generate waste heat. Such components can be a gradient coil arrangement and/or at least one gradient amplifier and/or a compressor of a cold head that cools the superconducting basic field magnet and/or radio frequency power amplifiers. Further components can be arithmetic processors or circuitry and/or transformers and/or network components of the magnetic resonance apparatus.

In an embodiment of the invention, for at least one component, at least two start temperatures respectively associated with different locations on the component, from respective measured variables, are used, and at least two corresponding comparison variables are each jointly determined from the start temperatures and the power data. When a number of start temperatures on one of the components is considered, a much more accurate analysis of the power-based cooling behavior is possible. For example, a start temperature can be based on an entry region of coolant of the cooling system into the components and a further start temperature is based on an exit region of coolant of the cooling system out of the component. It is therefore possible, for example, for an input temperature and an output temperature of the component to be determined by measurement, such as for a power amplifier (RFPA and/or GPA). There does not necessarily have to be an arrangement of multiple temperature sensors on the component cooled by the cooling system; instead, particularly with a sequence of serially cooled components, conclusions can optionally be made on the basis of previously or subsequently cooled components on the sequence.

A preferred embodiment of the invention, therefore, is used with serial cooling of a number of components, in particular along a cooling branch. In this case, the start temperature, based on the exit region, of a component and/or a general start temperature of another component, is used as a start temperature. This start temperature can be at the entry region of a following component, and/or at the exit region of a preceding component. A general start temperature of a component means a single and/or averaged and/or any start temperature of the currently unused component. The reduction in the number of sensors is thereby achieved by intelligent use of temperature sensors in branches of serially cooled components. For example, with such serial circuits of components of the temperature sensor, a subsequent, currently unused component can be used as a temperature sensor for the output temperature of the preceding component, if this component does not have a direct temperature sensor in the exit region. Conversely, the input temperature of a subsequent component can be detected by a temperature sensor associated with an unused preceding component in order to thus determine a start temperature or measured variable for the entry region.

Evaluation processes can be based on different periods connected to the power input. The temperature change thus can be based on at least one period, wherein the durations of the power input and/or a post-cooling phase following the power input are used as the periods. For example, a temperature change, in particular therefore a temperature increase, can be measured and considered during the power input itself, so a temperature increase due to the power input and the dissipation of heat that already occurs at the same time due to the coolant are measured. It can also be expedient, however, to use post-cooling phases that immediately follow the power input as the period, so only the dissipation of heat introduced due to the power input is measured. Therefore there is the possibility for direct measurement of cooling capacity. In this case, the temperature change relates (with functioning of the cooling system) to cooling.

Different categories of comparison variables can be used and employed within the framework of the present invention, and these can also be used cumulatively to obtain optimally extensive information with respect to the functionality of the cooling system.

In another embodiment of the present invention, at least one of the at least one comparison variables describes a maximum permissible temperature increase. In this case, a minimum required cooling capacity is provided based on the power data and the start temperature. For example, an action criterion can check whether this maximum permissible temperature change (in particular a temperature increase during the power input) is fallen below. For example, a number of warning stages can be provided, which correspond to different comparison variables. It is not necessary for every one of these warning stages to require the output of a warning signal, it is instead possible just to initiate further evaluation processes and/or logging processes. This can occur, for example, in the case of lower comparison variables, whereas actual warning signals are emitted only in the case of higher comparison variables, and/or the controller of the magnetic resonance apparatus can be adjusted. The comparison variables are therefore a type of desired demand on the cooling capacity.

For specific determination of the at least one comparison variable that describes a maximum permissible temperature increase, the one comparison variable that describes maximum permissible temperature increase can be determined at least partially by a calculation using a temperature change model of the components. This model can be created once for a particular set of power data and start temperature, and/or can be retrieved from a performance map and/or a lookup table. Therefore, a respective temperature change model can be associated with every component, and this can be in the form of a formula and/or a simulation and/or values already calculated in advance, in a performance map and/or a lookup table. The temperature change model can describe, for example, the elevation in temperature as a function of time $T(t)$ and as a function of the start temperature $T0$, the power P and the duration of the power input $\Delta t$ as power data. A power input per unit of time, which constitutes a different example of power data, may therefore also be derived from the power data (input power and duration of the power input). A maximum permissible temperature increase due to the power input, and optionally also an admissible temperature increase range, can be determined as a function of the input variables of the temperature change model. Exceeding the maximum permissible temperature increase can be associated here with insufficient flow of the coolant, which leads to an excessive temperature increase. In general, this means that exceeding a comparison variable that describes a maximum permissible temperature increase points toward a reduced flow rate. A maximum permissible temperature increase, resulting from the temperature change model, as the comparison variable can be compared with correspondingly measured measuring variables, so ultimately the flow is measured purely on the basis of temperature sensors.

It should be noted that at least one of the at least one comparison variables that describes a maximum permissible temperature increase can already be specified "ex works", for example with respect to a demand on the cooling system that is defined at the time of manufacture.

In a further embodiment of the present invention, at least one of the at least one comparison variables that describes a maximum permissible temperature increase is determined at least partially by a calibration measurement during startup of the magnetic resonance apparatus. Calibration at the manufacturer's factory is also conceivable, but the calibration measurement is preferably carried out at the site of use during startup of the magnetic resonance apparatus, in other words, during what is known as a tune-up. The last-mentioned variant has the advantage that the variations that are present due to different hydraulic balancing of individual sub-systems, and due to the tolerances of the components within a cooling series, are detected by the calibration. Therefore, smaller tolerance windows, in particular more strongly defined comparison variables, can be used so as to be able to detect faults, or slowly forming faults, more sensitively.

Of course, results of a temperature change model and a calibration can also be combined, either to form a common comparison variable and/or a number of comparison variables.

The embodiments described here may of course be applied as well, particularly with measurement in a post-cooling phase, to corresponding minimal permissible cooling, since in the case where there is no longer an existing power input, a particular minimum cooling by the cooling system can be anticipated.

Embodiments of the present invention are also possible wherein, in addition to the comparison variable that describes a maximum permissible temperature increase and/or minimal permissible cooling, a comparison variable that describes a minimal permissible temperature increase or maximum permissible cooling is used. An embodiment of this kind is useful, for example, if a plausibility check with respect to potential measuring errors of the temperature sensors is to take place. A type of permissibility range is then defined therefore.

In a further embodiment of the present invention, at least one of the at least one comparison variables describes a temperature increase measured in the past and/or a temperature increase relating to a component of the magnetic resonance apparatus with the same function. For example, a development over time of the cooling device over time can be observed, such as a slowly degrading cooling capacity and therefore supposedly reduced flowrates, in which the measured variable, for example when considering the temperature increase, continuously increases. Furthermore, a comparison of a number of individually similar components can be used, for example of the three gradient amplifiers provided for the respective Cartesian directions, or different power stages of the gradient amplifier. With the same electrical load in each case, in other words with the same power input in each case, these should exhibit a similar temperature behavior due to the effect of the cooling system.

In this embodiment it is advantageous to plot over time a number of comparison variables, acquired in the past as measured variables, that describe changes in temperature measured for a monitored component, and to form the current measured variable as a temperature change characteristic based on the plot, which is evaluated by at least one action criterion. Due to the evaluation of the course over time, an implicit comparison takes place that enables trends to be determined, for example increasing blockage of a cooling line or the like. A temperature change characteristic of this kind is expediently also logged in order, for example by subsequent evaluations (manually or automatically), to be able to determine causes of faults, determine problems in the cooling system, and/or to improve future developments.

Different embodiments are conceivable for the point in time at which monitoring of the cooling system occurs, and these can make different demands. Therefore, in a first of such embodiment the monitoring occurs during the acquisition of raw data from the reconstruction of an image by the scanner of the magnetic resonance apparatus. A power model that determines power data from current operating parameters of the magnetic resonance scanner, in particular sequence parameters of a magnetic resonance sequence, is used. Since the course of image acquisition processes with the magnetic resonance scanner cannot be foreseen in many cases, or the connections between the operating parameters, in particular the sequence parameters, and the power inputs is not necessarily completely or sufficiently accurately known, "inline" monitoring of this kind requires more complex modelling, since it must be possible to convert any operating parameters, in particular sequence parameters, into a corresponding power input, such as by considering the other components. The temperature change models and the power models can also expediently be combined to form a common component model, so then the operating parameters, in particular sequence parameters, can be used directly as input data in addition to the start temperatures, and the power data can be implicitly determined.

In a preferred embodiment of the present invention, monitoring occurs in dedicated, manually and/or automatically begun monitoring phases in which the magnetic resonance scanner is operated with predetermined operating parameters, whose associated power data are known. In this case the measurement for monitoring the function of the cooling system can be automatically carried out, for example by manual start of dedicated service functions and/or outside of the magnetic resonance scan in periods in which the magnetic resonance apparatus is being operated but is not being used for image acquisition. In a preferred embodiment, the monitoring phase can be automatically started in scanning breaks of the image acquisition operation, in particular with an examination table of the magnetic resonance scanner in a home position, and/or due to a service signal obtained via a communications link, and/or from an operator control entry. With use in image acquisition breaks of the magnetic resonance scanner, for example with a particular position of the examination table (home position), the measurement or measurement sequence to be carried out for monitoring is terminated or interrupted as soon as an image acquisition is started. A manual start of a measurement for monitoring is also conceivable, such as by a service signal that can be generated locally or remotely, for example by a service center.

In conjunction with monitoring in monitoring phases it is preferred that in at least on portions of the monitoring phases, only individual components are subjected to power. For example, particular monitoring functions can be implemented as individual data acquisition processes in which only one component, or one component per branch of the cooling system, is subjected to known power, and the thermal behavior over time is measured. This can be considered as a type of "impulse response". If only data acquisitions processes of this kind are used, the corresponding connections, and therefore also the comparison variables, may be particularly easily and selectively derived, therefore made available in a lookup table or the like, so a reliable comparison basis also results with comparison of different magnetic resonance apparatuses and/or with monitoring of the course over time.

With the use of automatically started monitoring phases, these phases are started only until a requisite data volume and/or scanning frequency is achieved. For example, complete determination/data acquisition, as a sequence of a number of data acquisition processes as described above, and optionally evaluation of all comparison results, is demanded once a day, once a week, once a month or the like. Monitoring therefore proceeds automatically such that at least one complete data acquisition is concluded in a predefined time interval.

In another embodiment of the present invention, during evaluation of the comparison results at least one additional variable that describes an ambient condition during measurement of the measured variables is considered. Therefore further conditions, under which monitoring occurs, can be incorporated in the evaluation of the monitoring results. Additional variables of this kind, in particular with "inline" monitoring, can relate to the state of further components, which can have effects on consideration of a particular component. The ambient conditions include ambient conditions of the magnetic resonance scanner per se. In an embodiment of the present invention, at least one of the at least one additional variables can be a weather condition, in particular an external temperature. It should also be noted that additional variables, which the magnetic resonance apparatus itself may not supply, for example external temperature values, can also be retrieved from external devices, for example from the Internet and/or from commercial providers, for example weather data providers. The consideration of such additional variables, based on weather conditions, enables recognition of causes of faults that are connected with a high external temperature.

The comparison results can be evaluated by the at least one action criterion and/or the subsequent evaluation can take place on a control computer of the magnetic resonance apparatus and/or an arithmetic processor external to or remote from the magnetic resonance apparatus. The arithmetic processor may be associated with a manufacturer of the magnetic resonance apparatus and/or a service provider. This also applies to the determination of the comparison results themselves so, for example, measured data of the temperature sensors can be transmitted via a bus system and/or other communication connections, first to the control computer of the magnetic resonance apparatus and/or the arithmetic processor before the measured variables are determined and/or the comparison is explicitly or implicitly made. The input data and/or measured data thus can be evaluated overall by the magnetic resonance apparatus itself or "offline" by transfer to a central arithmetic processor, such as a server. The use of an external, remote, central arithmetic processor, which preferably takes care of monitoring a number of magnetic resonance apparatuses, has the advantage that magnetic resonance apparatuses of the same type can be compared with each other in the field.

In a further embodiment, at least one of the at least one comparison variables, a measured variable of a different magnetic resonance apparatus is used. A different magnetic resonance apparatus of the same type and/or with the same equipment and/or a component of the same type and/or with the same equipment can be used with the same cooling system. In this way it can be monitored whether a cooling capacity degradation should be attributed to general ageing, or constitutes a specific problem of the magnetic resonance apparatus in question. Comparison of monitoring of cooling systems of different magnetic resonance apparatuses with each other therefore contributes to more accurate analysis of the state of the cooling system.

In addition to the method the invention also concerns a magnetic resonance apparatus, having a cooling system for cooling a number of components, at least some of the components having temperature sensors associated therewith, and a control computer designed to implements the inventive method. All statements with respect to the inventive method apply analogously to the inventive magnetic resonance apparatus, including the described advantages.

The present invention also encompasses a non-transitory, computer-readable data storage medium encoded with programming instructions (program code) that, when the storage medium is loaded into a computer or computer system of a magnetic resonance apparatus or a processor that is external to the magnetic resonance apparatus, cause the computer or computer system or processor to execute any or all of the embodiments of the method according to the invention, as described above.

The data carrier can be, for example, a CD-ROM.

DESCRIPTION OF THE PREFERRED EMBODIMENTS

Figure 1:
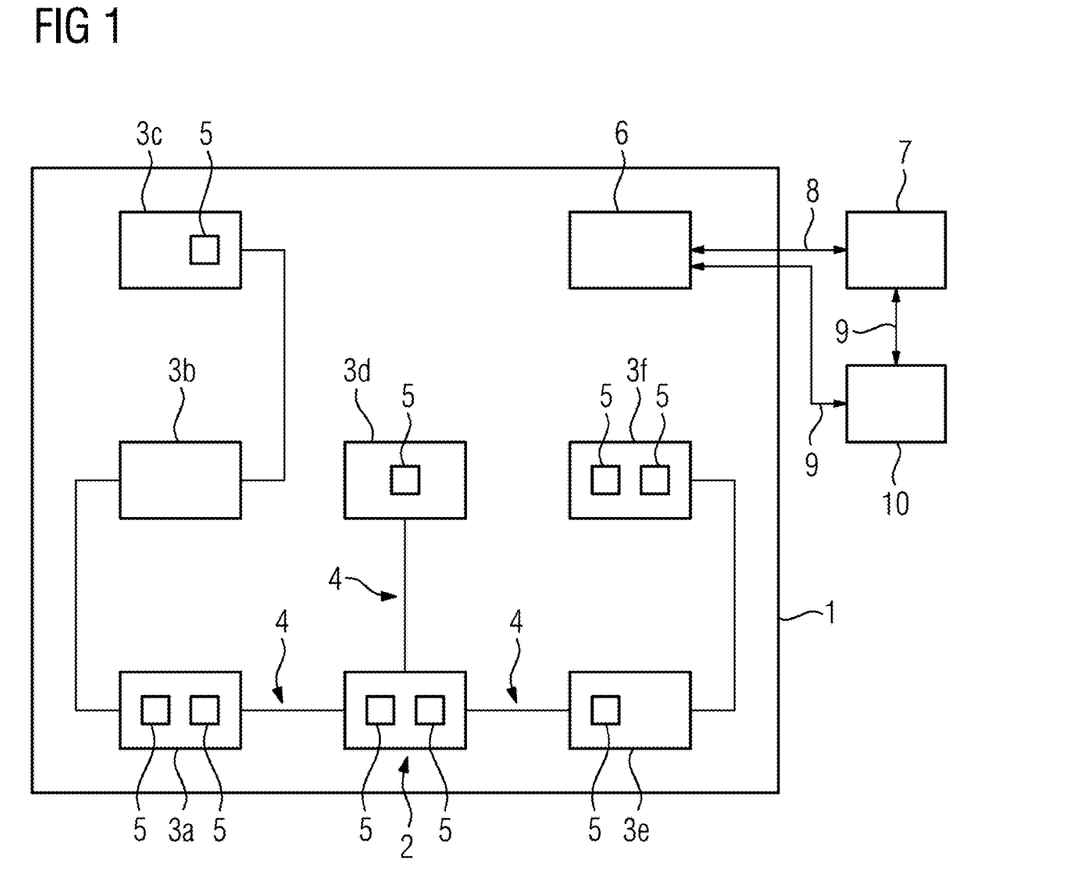
FIG. 1 is a block diagram of the inventive magnetic resonance apparatus.

FIG. 1 is a block diagram of an inventive magnetic resonance apparatus 1, wherein for simplicity only components relevant to the present invention relevant are shown. Further components, such as a superconductive basic field magnet, a cooling devices associated therewith, various coil arrangements and the like are of course present as is known in the art.

The magnetic resonance apparatus 1 is an MR data acquisition scanner that has a cooling system 2, which in the present case uses water as the coolant and which is used for cooling components 3a to 3f in various cooling branches 4, in which components 3a to 3f can be serially cooled. The coolant is led through cooling lines that can run through the components 3a to 3f. Corresponding return transport lines are not shown for clarity, but are of course present.

As part of the magnetic resonance apparatus 1, temperature sensors 5 are provided on various components 3a to 3f or are associated therewith, and these supply corresponding temperature values as the measured data. These temperature values can be associated, optionally also only temporarily, with various components 3a to 3f, as will be illustrated.

Figure 2:
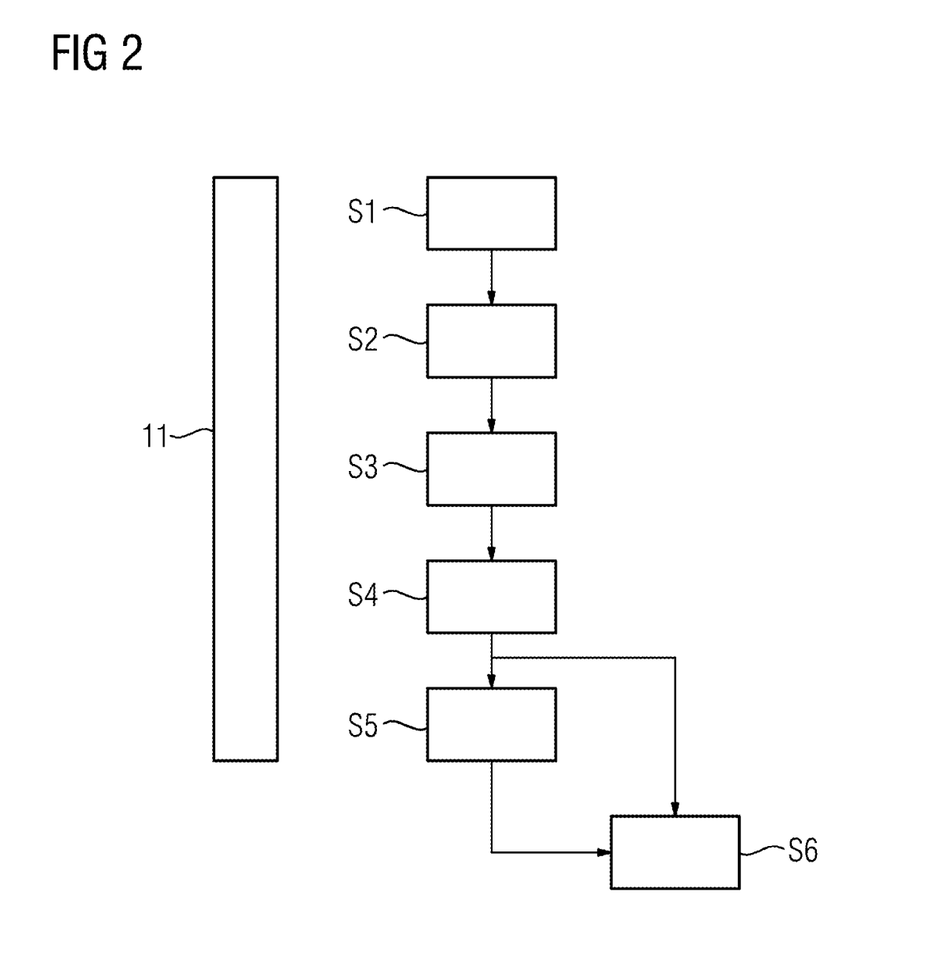
FIG. 2 is a flowchart of a first exemplary embodiment of the inventive method.

It should be noted that, although less preferred, temperature sensors and/or flow sensors that can be used so as to be dedicated for the cooling system 2, wherein, in the present case in FIG. 2 optional temperature sensors 5 are at least indicated on cooling system components. Cooling system temperature sensors 5 of this kind, for example, can monitor the temperature of outflowing or returning coolant for the cooling branches 4.

The magnetic resonance apparatus 1 also has a control computer 6 which can be designed for carrying out the inventive method. This means functioning of the cooling system 2 can be at least partially monitored by the control computer 6 using the measured data of the temperature sensors 5, which are provided for the control computer 6. The function of the cooling system 2 can also be at least partially monitored by a central arithmetic processor 7, for example a server, external to the magnetic resonance apparatus 1 and arranged remotely therefrom. The server can communicate via an appropriate communications link 8, which can be the Internet, with the control computer 6 in order to exchange the required data. Essentially complete implementation of monitoring by the central arithmetic processor 7 is also conceivable, with the measured data of the temperature sensors 5, power data and the like then being supplied by the communications link 8 to the arithmetic processor 7.

The control computer 6 and the arithmetic processor 7 can communicate via appropriate communications links 9 with further data sources 10, to determine additional variables, used during the course of monitoring of the function of the cooling system 2, which cannot be determined by the magnetic resonance apparatus 1, for example additional variables that describe weather conditions, such as the external temperature.

Measured data of the temperature sensors 5 can be associated with components 3a to 3f, wherein the temperature sensors 5 do not necessarily have to be secured directly on the component for this purpose, although this can be provided. Components 3a and 3f have for example two temperature sensors 5 which can measure temperature values in an entry region of the coolant and in an exit region of the coolant. Components 3c and 3e each have a temperature sensor 5 that measures in the entry region; component 3d only has a temperature sensor 5 that measures generally at the component 3d. Nevertheless, temperature values may also be determined, for example also for component 3b, for the entry region of the coolant and the exit region of the coolant, since for example temperature values of the temperature sensor 5 of component 3a arranged on the output-side are regarded as a measure of the entry-side temperature of component 3b, and this applies analogously to the entry-side temperature sensor 5 of component 3c and the exit region of component 3b. If component 3e, for example, is not currently operating, in other words there is no power input there, the temperature sensor 5 provided at the entry side there can even be used to obtain temperature values for component 3f if component 3f should not include a temperature sensor or a functioning temperature sensor.

Components 3a to 3f can specifically comprise a gradient coil arrangement and/or at least a gradient amplifier and/or a compressor for driving a cold head for cooling the superconducting basic field magnet and/or a radio frequency power amplifier and/or arithmetic devices and/or transformers and/or network components.

The inventive method shall be illustrated below in the form of two specific exemplary embodiments, wherein the first exemplary embodiment according to FIG. 2 relates to monitoring the function of the cooling system 2 during image acquisition operation of the magnetic resonance apparatus 1. The second exemplary embodiment according to FIG. 3 relates to monitoring in monitoring phases that can be started manually and/or automatically.

According to the exemplary embodiment in FIG. 2, the running image acquisition operation is indicated by the boxes 11. During image acquisition operation, power inputs into the components 3a to 3f are caused by use of appropriate operating parameters of the magnetic resonance apparatus 1, in particular sequence parameters of a magnetic resonance sequence. These power inputs lead to a temperature increase of corresponding components 3a to 3f, wherein the temperature behavior of the respective components 3a to 3f is to be assessed in respect of this power input in order to check functioning of the cooling system 2. The steps described below do not have to proceed completely in the stated order; it is apparent that mutually independent steps, in particular determining steps, can be changed in terms of their order and/or can be performed simultaneously.

Power data is determined in a step S1 for components 3a to 3f, in which a power input occurs on the basis of the operating parameters, from the operating parameters, in particular the sequence parameters. In the present case the power data describes an input power and the duration of the power input. A power model is used here, with the aid of which the operating parameters can be converted into the power data.

Immediately before the start of the power input into the corresponding components 3a to 3f, at least one start temperature of components 3a to 3f is determined in a step S2 by using the temperature sensors 5, as described above.

By using the at least one start temperature, wherein in particular start temperatures for the entry region and the exit region are used, as described above, and the power data, at least one comparison variable is determined in a step S3 for which various possibilities are conceivable. In the present case at least one of the at least one comparison variables should be a maximum permissible temperature increase of the components 3a to 3f considered during the power input, with the cooling system 2 counteracting the waste heat produced there. A comparison variable of this kind is preferably based in the present case here on a temperature change model, since, owing to the large number of different operating states of the magnetic resonance apparatus 1 which can occur during image acquisition operation, a large number of combinations of start temperatures and power data can result, for which comparison values cannot always be provided in sufficient number in a lookup table and/or a performance map. Of course, when using a lookup table and/or a performance map, the basis of the comparison variables contained therein can likewise be the temperature change model, therefore a pre-calculation can have taken place. The temperature change model, which maps the thermal behavior of components 3a to 3f under the influence of the power input and a desired functionality of the cooling system 2, can optionally be given in the form of a mathematical formula and/or another mathematical correlation, but can also be used for determination in the form of a simulation.

Further comparison variables can also be provided in step S3, for example measured variables measured in the past with the temperature sensors 5 with the same power data and at the same at least one start temperature. In particular a change over time in the cooling behavior can be observed thereby. Comparison variables can also include measured variables of comparable components 3a to 3f, for example of power amplifiers for gradient coils of a different direction and the like. Finally, in particular with implementation by the arithmetic processor 7, corresponding measured variables of different magnetic resonance apparatuses, in particular of the same type, can also be used as comparison variables to allow a comparison between magnetic resonance apparatuses.

One of the measured variables corresponding to the comparison variable, in particular a temperature change that has occurred during the period of the power input and/or a different period, is determined in a step S4 by measurement using the temperature sensors 5.

It should also be noted that of course other periods can also be considered, for example a post-cooling period, which directly follows the power input, wherein minimal permissible cooling can then be used as at least one of the at least one comparison variables.

Evaluation then takes place in steps S5 and S6 by comparison of the at least one comparison variable with the measured variable. According to step S5, by direct evaluation of the comparison result by means of action criteria it can be checked immediately afterwards whether states of the cooling system 2 exist that require actions, for example a fault which can lead to altered control of the cooling system 2 and/or magnetic resonance apparatus 1 and/or to outputting of a warning signal as an action.

Action criteria can also be checked in an evaluation step S6 after an interval, for example by the arithmetic processor 7, and/or other evaluation actions follow in respect of the comparison results. The comparison results are logged within the control computer 6 and the arithmetic processor 7. In particular, a measured variable course for the examined components 3a to 3f is also stored for identical start temperatures and identical power inputs in order to be able to read trends which can point for example toward slowly clogging coolant lines or the like.

Figure 3:
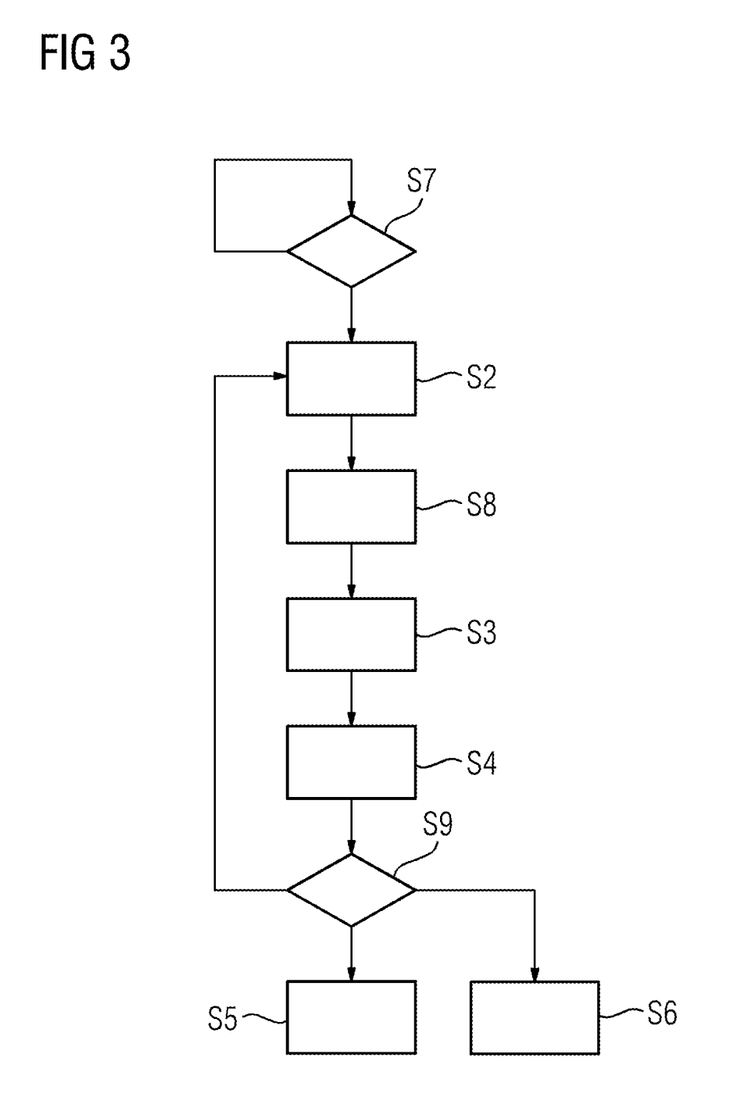
FIG. 3 is a flowchart of a second exemplary embodiment of the inventive method.

FIG. 3 shows a second exemplary embodiment of the inventive method in which monitoring of the function of the cooling system 2 takes place outside of image acquisition operation in monitoring phases that can be started manually and/or automatically. First, in a step S7, it is monitored whether a monitoring condition is fulfilled, with a manual start of a monitoring phase in other words whether a corresponding service signal received by an operator control or by way of the communications link 8 exists, with the preferred automatic design, whether a break in scanning of image acquisition operation exists in which the examination table is in a home position extended out of a patient support of the magnetic resonance apparatus 1.

The monitoring phase can comprise a number of data acquisition processes which relate in particular to individual components 3a to 3f in each case or at least to just one component 3a to 3f per cooling branch 4 in each case. For this kind of data acquisition process, which is characterized by a specific, known power input, determined by known power data, into an individual component 3a to 3f or an individual component 3a to 3f of a cooling branch 4, first, in a step S2 corresponding to the first exemplary embodiment, the start temperatures of the relevant components 3a to 3f are determined, again by measurement with the temperature sensors 5. The power data are of course already known.

In a step S8 the magnetic resonance apparatus 1 is controlled by the control computer 6 such that the corresponding power input described by the power data, which input is provided for this data acquisition process, is made into the components 3a to 3f relevant to this data acquisition process, but other components 3a to 3f remain essentially unaffected.

The step of determining the at least one comparison variable that now follows (but which can optionally also be performed before or after) again corresponds to step S3, with it being preferred here, due to the strictly predefined power inputs for the (few) data acquisition processes, that a lookup table is used to retrieve the at least one comparison variable.

The measured variables may again be determined as in step S4 on the basis of the control in step S8.

It is then checked in a step S9 whether further data acquisition processes still need to be carried out, wherein in this case the method advances to the next data acquisition process and again branches off to step S2. Once all data acquisition processes are concluded, the data are again evaluated in steps S5 and S6 corresponding to the first exemplary embodiment by determining the comparison results, logging the same and/or evaluating the same in action criteria.

It should be noted that it can also be checked in step S7 whether all data acquisition processes have already been carried out once within a particular time interval, so all data acquisition processes can therefore be carried out once a day, once a week, once a month or the like. If the data acquisition processes have all already been carried out for the predefined time interval, then no monitoring phase has to take place either. Furthermore, when an image acquisition is requested during a monitoring phase it is conceivable to interrupt the monitoring phase until, according to monitoring in step S7, the monitoring condition is fulfilled again, so then the monitoring phase can be continued accordingly with the remaining data acquisition processes.

The evaluation in steps S5 and S6 can also consider additional variables, for example the external temperature or general weather conditions already mentioned. Appropriate functional units, for example determining units for the various variables, control units and the like, can be provided for specific implementation of the method within the control computer 6 and/or the arithmetic processor 7.

Finally reference should also be made to the fact that in preferred exemplary embodiments at least some of the at least one comparison variable can also incorporate results of a calibration measurement or comparison variables can also be determined completely on the basis of such a calibration measurement. A calibration measurement of this kind preferably takes place during startup of the magnetic resonance apparatus 1.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for monitoring functioning of a cooling system of a magnetic resonance apparatus comprising a plurality of components that are cooled by the cooling system, and a plurality of temperature sensors in thermal communication with at least some of said components, said method comprising:

with at least one of said temperature sensors associated with at least one of said components determining a start temperature of said at least one of said components;

providing said start temperature to a computer, selected from the group consisting of a control computer of the magnetic resonance apparatus and a processor that is external to the magnetic resonance apparatus, and in said computer, determining, from said start temperature, at least one comparison variable that describes a reference temperature change due to a power input to said at least one of said components;

with said at least one of said temperature sensors, measuring a measured variable that describes a temperature change that actually occurs due to said power input to said at least one of said components; and in said computer, comparing said measured variable with said comparison variable to obtain a comparison result, and determining whether said comparison result fulfills an action criterion having an action associated therewith and, if said action criterion is fulfilled, initiating at least one of said action associated with said action criterion, or logging said comparison result in a memory.

2. A method as claimed in claim 1 comprising determining said at least one comparison variable so as to describe said reference temperature change as a temperature change that occurs during a period selected from the group consisting of a duration of said power input, and a duration of a post-cooling phase that follows said power input.

3. A method as claimed in claim 1 comprising determining said at least one comparison variable that describes said reference temperature change using at least one temperature change selected from the group consisting of a temperature change for said one of said components measured before determining said start temperature, and a temperature change of a different component from said one of said components that performs the same function in said magnetic resonance apparatus as said one of said components.

4. A method as claimed in claim 1 comprising implementing said monitoring of functioning of said cooling system during operation of said magnetic resonance apparatus in order to acquire raw image data, and wherein said power input is a time-based power input that results from operating parameters of the magnetic resonance apparatus used in said operation, and providing said computer with power data representing said time-based power input and, in said computer, determining a power model from said power data, and determining said at least one comparison variable using said power model and said start temperature.

5. A method as claimed in claim 1 comprising evaluating whether said action criterion is fulfilled by said comparison result so as to include evaluation of an additional variable that describes ambient conditions that existed during measurement of said at least one measured variable.

6. A method as claimed in claim 1 wherein said power input is a time-based power input, and comprising providing power data to said computer that describes said time-based power input, and determining said comparison variable in said computer from said start temperature and said power data.

7. A method as claimed in claim 6 comprising providing said computer with at least two start temperatures for said at least one of said components, said at least two start temperatures being respectively associated with different locations, determining respective measured variables for each of said at least two start temperatures jointly from the respective start temperatures and the power data.

8. A method as claimed in claim 7 comprising determining one of said at least two start temperatures at a location representing entry of coolant of said cooling system into said at least one of said components, and determining a second of said at least two start temperatures at a different location describing exit of said coolant from said one of said components.

9. A method as claimed in claim 8 wherein said components are serially cooled in a sequence through which said coolant of said cooling system flows, and comprising detecting said first start temperature from a temperature sensor associated with a currently unused component that precedes said one of said components in said sequence.

10. A method as claimed in claim 8 wherein said components are serially cooled in a sequence through which said coolant of said cooling system flows, and comprising detecting said second start temperature from a temperature sensor associated with a currently unused component that follows said one of said components in said sequence.

11. A method as claimed in claim 1 comprising determining said at least one comparison variable so as to describe, as said reference change, a maximum permissible temperature increase for said one of said components.

12. A method as claimed in claim 11 comprising determining said at least one comparison variable that describes the maximum permissible temperature increase for said one of said components using calibration data obtained by operating said magnetic resonance apparatus to implement a calibration measurement.

13. A method as claimed in claim 11 comprising determining said at least one comparison variable that describes said maximum permissible temperature increase for said one of said components by a calculation using a temperature change model of said one of said components.

14. A method as claimed in claim 13 comprising acquiring said temperature change model in said computer by retrieving said temperature change model from a memory.

15. A method as claimed in claim 13 wherein said power input is a time-based power input, and comprising providing power data to said computer that describes said time-based power input, and determining said comparison variable in said computer from said start temperature and said power data, and acquiring said temperature change model in said computer by making a one-time calculation of said temperature model in said computer using said power data and said start temperature.

16. A method as claimed in claim 15 comprising plotting said temperature change selected from said group over time for a plurality of comparison values in order to obtain a temperature change characteristic as said comparison result that is applied to said action criterion.

17. A method as claimed in claim 1 comprising implementing said monitoring of functioning of said cooling system during each of a plurality of dedicated monitoring phases that occur during an operation of said magnetic resonance apparatus according to predetermined operating parameters from which power data, representing said power input of said one of said components in each of said monitoring phases, are known, and providing said power data to said computer and determining said at least one reference variable in said computer from said power data and said start temperature.

18. A method as claimed in claim 17 comprising automatically starting each monitoring phase at a time when said operation of said magnetic resonance apparatus is interrupted, and selecting said time from the group consisting of a time when a patient bed of said magnetic resonance apparatus is situated in a home position, and a time at which a service signal from an external source is received by said computer.

19. A method as claimed in claim 17 wherein, during each monitoring phase, only selected components in said plurality of components are provided with said power input.

20. A magnetic resonance apparatus comprising:
a plurality of components;
a cooling system that cools said plurality of components;
a plurality of temperature sensors respectively associated with at least some of said components in said plurality of components;
at least one of said temperature sensors associated with at least one of said components being configured to determine a start temperature of said at least one of said components;
a computer provided said start temperature, said computer being selected from the group consisting of a control computer of the magnetic resonance apparatus and a processor that is external to the magnetic resonance apparatus, and said computer being configured to determine, from said start temperature, at least one comparison variable that describes a reference temperature change due to a power input to said at least one of said components;
said at least one of said temperature sensors being configured to measure a measured variable that describes a temperature change that actually occurs due to said power input to said at least one of said components; and
said computer being configured to compare said measured variable with said comparison variable to obtain a comparison result, and to determine whether said comparison result fulfills an action criterion having an action associated therewith and, if said action criterion is fulfilled, to initiate at least one of said action associated with said action criterion, or logging said comparison result in a memory.

21. A non-transitory, computer-readable data storage medium encoded with programming instructions, said storage medium being loaded into a computer in communication with a magnetic resonance apparatus, and magnetic resonance apparatus comprising a plurality of components that are cooled by a cooling system, and temperature sensors respectively associated with at least some components in said plurality of components, said programming instructions causing said computer to:
receive, from at least one of said temperature sensors associated with at least one of said components a start temperature of said at least one of said components;
determine, from said start temperature, at least one comparison variable that describes a reference temperature change due to a power input to said at least one of said components;
receive, from said at least one of said temperature sensors, a measured variable that describes a temperature change that actually occurs due to said power input to said at least one of said components; and
compare said measured variable with said comparison variable to obtain a comparison result, and determine whether said comparison result fulfills an action criterion having an action associated therewith and, if said action criterion is fulfilled, initiate at least one of said action associated with said action criterion, or logging said comparison result in a memory.

* * * * *